United States Patent
Chen et al.

(10) Patent No.: US 7,082,056 B2
(45) Date of Patent: Jul. 25, 2006

(54) FLASH MEMORY DEVICE AND ARCHITECTURE WITH MULTI LEVEL CELLS

(75) Inventors: Ben Wei Chen, Fremont, CA (US); Augustine W. Chang, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 141 days.

(21) Appl. No.: 10/800,228

(22) Filed: Mar. 12, 2004

(65) Prior Publication Data

US 2005/0201148 A1    Sep. 15, 2005

(51) Int. Cl.
*G11C 16/06*    (2006.01)

(52) U.S. Cl. .............................. 365/185.2; 365/185.21; 365/185.03

(58) Field of Classification Search ............... None
See application file for complete search history.

(56) References Cited

U.S. PATENT DOCUMENTS

| | | | |
|---|---|---|---|
| 5,485,422 A | 1/1996 | Bauer et al. ................ | 365/168 |
| 5,539,690 A | 7/1996 | Talreja et al. .......... | 365/185.22 |
| 5,748,536 A | 5/1998 | Kwon et al. ........... | 365/185.25 |
| 5,768,188 A | 6/1998 | Park et al. ............. | 365/185.03 |
| 5,973,957 A | 10/1999 | Tedrow .................. | 365/185.03 |
| 6,091,618 A | 7/2000 | Fazio et al. .................... | 365/45 |
| 6,097,635 A * | 8/2000 | Chang .................... | 365/185.21 |
| 6,097,637 A | 8/2000 | Bauer et al. ........... | 365/185.24 |
| 6,115,290 A | 9/2000 | Kwong .................. | 365/185.25 |
| 6,178,114 B1 | 1/2001 | Yang ..................... | 365/185.03 |
| 6,483,742 B1 | 11/2002 | Sweha et al. .......... | 365/185.03 |
| 6,611,460 B1 | 8/2003 | Lee et al. .............. | 365/185.18 |
| 6,625,062 B1 * | 9/2003 | Won et al. ............. | 365/185.21 |
| 6,639,837 B1 | 10/2003 | Takano et al. ......... | 365/185.22 |
| 6,717,848 B1 * | 4/2004 | Kim et al. ............. | 365/185.03 |

* cited by examiner

*Primary Examiner*—David Lam
(74) *Attorney, Agent, or Firm*—Sawyer Law Group LLP

(57) ABSTRACT

A FLASH memory has an array of FLASH cells that each store N multiple bits of information as charge stored on a floating gate. Reference voltages or currents are generated for each boundary between the $2^N$ states or levels and for an upper limit and a lower limit reference for each state. A selected bit line driven by a selected FLASH cell generates a sense node that is compared to a full range of $3*2^N-1$ comparators in parallel. The compare results are decoded to determine which state is read from the selected FLASH cell. An in-range signal is activated when the sense node is between the upper and lower limit references. The target programming count or programming pulses is adjusted during calibration to sense in the middle of the upper and lower limit references. Margin between references is adjusted by calibration codes that select currents for summing.

27 Claims, 15 Drawing Sheets

| CELL SIZE | PRIOR ART READ ACCESS TIME | INVENTION READ ACCESS TIME |
|---|---|---|
| 2-BIT PER CELL | TC + 2TS + TR | TC + TS + TR |
| 3-BIT PER CELL | TC + 3TS + TR | TC + TS + TR |
| N-BIT PER CELL | TC + nTS + TR | TC + TS + TR |
| DEFINITIONS | TC: READ ACCESS TIME FOR FLASH CELL<br>TS: SENSE AMP/COMPARATOR RESPONSE TIME<br>TR: TRANSLATION LOGIC DECODING TIME | |

| READ SUB-STATE | IL0 | IU0 | IR1 | IL1 | IU1 | IR2 | IL2 | IU2 | IR3 | IL3 | IU3 | RD-D1 | RD-D0 | READ-IN-RANGE | OVER | UNDER |
|---|---|---|---|---|---|---|---|---|---|---|---|---|---|---|---|---|
| 1 | 1 | 1 | 1 | 1 | 1 | 1 | 1 | 1 | 1 | 1 | 1 | 1 | 1 | 0 | 0 | 1 |
| 2 | 0 | 1 | 1 | 1 | 1 | 1 | 1 | 1 | 1 | 1 | 1 | 1 | 1 | 1 | 0 | 0 |
| 3 | 0 | 0 | 1 | 1 | 1 | 1 | 1 | 1 | 1 | 1 | 1 | 1 | 0 | 0 | 1 | 0 |
| 4 | 0 | 0 | 0 | 1 | 1 | 1 | 1 | 1 | 1 | 1 | 1 | 1 | 0 | 0 | 0 | 1 |
| 5 | 0 | 0 | 0 | 0 | 1 | 1 | 1 | 1 | 1 | 1 | 1 | 1 | 0 | 1 | 0 | 0 |
| 6 | 0 | 0 | 0 | 0 | 0 | 1 | 1 | 1 | 1 | 1 | 1 | 0 | 1 | 0 | 1 | 0 |
| 7 | 0 | 0 | 0 | 0 | 0 | 0 | 1 | 1 | 1 | 1 | 1 | 0 | 1 | 0 | 0 | 1 |
| 8 | 0 | 0 | 0 | 0 | 0 | 0 | 0 | 1 | 1 | 1 | 1 | 0 | 1 | 1 | 0 | 0 |
| 9 | 0 | 0 | 0 | 0 | 0 | 0 | 0 | 0 | 1 | 1 | 1 | 0 | 0 | 0 | 1 | 0 |
| 10 | 0 | 0 | 0 | 0 | 0 | 0 | 0 | 0 | 0 | 1 | 1 | 0 | 0 | 1 | 0 | 1 |
| 11 | 0 | 0 | 0 | 0 | 0 | 0 | 0 | 0 | 0 | 0 | 1 | 0 | 0 | 0 | 0 | 0 |
| 12 | 0 | 0 | 0 | 0 | 0 | 0 | 0 | 0 | 0 | 0 | 0 | 0 | 0 | 0 | 1 | 0 |

| READ-VERIFY STATE | WR-D1 | WR-D0 | RD-D1 | RD-D0 | READ-VERIFY EQUAL | READ-VERIFY LESS |
|---|---|---|---|---|---|---|
| 1  | 0 | 0 | 0 | 0 | 1 | 0 |
| 2  | 0 | 0 | 0 | 1 | 0 | 0 |
| 3  | 0 | 0 | 1 | 0 | 0 | 0 |
| 4  | 0 | 0 | 1 | 1 | 0 | 0 |
| 5  | 0 | 1 | 0 | 0 | 0 | 1 |
| 6  | 0 | 1 | 0 | 1 | 1 | 0 |
| 7  | 0 | 1 | 1 | 0 | 0 | 0 |
| 8  | 0 | 1 | 1 | 1 | 0 | 0 |
| 9  | 1 | 0 | 0 | 0 | 0 | 1 |
| 10 | 1 | 0 | 0 | 1 | 0 | 1 |
| 11 | 1 | 0 | 1 | 0 | 1 | 0 |
| 12 | 1 | 0 | 1 | 1 | 0 | 0 |
| 13 | 1 | 1 | 0 | 0 | 0 | 1 |
| 14 | 1 | 1 | 0 | 1 | 0 | 1 |
| 15 | 1 | 1 | 1 | 0 | 0 | 1 |
| 16 | 1 | 1 | 1 | 1 | 1 | 0 |

FIG. 11

| CURRENT REFERENCE NODE | CURRENT REFERENCE |
|---|---|
| RN-IU3 | IU3 |
| RN-IL3 | IL3 = IU3 + DELTA IL3 |
| RN-IR3 | IR3 = IL3 + DELTA IR3 |
| RN-IU2 | IU2 = IR3 + DELTA IU2 |
| RN-IL2 | IL2 = IU2 + DELTA IL2 |
| RN-IR2 | IR2 = IL2 + DELTA IR2 |
| RN-IU1 | IU1 = IR2 + DELTA IU1 |
| RN-IL1 | IL1 = IU1 + DELTA IL1 |
| RN-IR1 | IR1 = IL1 + DELTA IR1 |
| RN-IU0 | IU0 = IR1 + DELTA IU0 |
| RN-IL0 | IL0 = IU0 + DELTA IL0 |

FIG. 12A

| WEIGHT OF ID | 1/2 | 1/4 | 1/8 | 1/16 | DELTA REFERENCE CURRENT |
|---|---|---|---|---|---|
| CALIBRATION CODE | QP31 | QP32 | QP33 | QP34 | |
| 0 | 0 | 0 | 0 | 0 | 0 |
| 1 | 0 | 0 | 0 | 1 | 1/16 |
| 2 | 0 | 0 | 1 | 0 | 2/16 |
| 3 | 0 | 0 | 1 | 1 | 3/16 |
| 4 | 0 | 1 | 0 | 0 | 4/16 |
| 5 | 0 | 1 | 0 | 1 | 5/16 |
| 6 | 0 | 1 | 1 | 0 | 6/16 |
| 7 | 0 | 1 | 1 | 1 | 7/16 |
| 8 | 1 | 0 | 0 | 0 | 8/16 |
| 9 | 1 | 0 | 0 | 1 | 9/16 |
| 10 | 1 | 0 | 1 | 0 | 10/16 |
| 11 | 1 | 0 | 1 | 1 | 11/16 |
| 12 | 1 | 1 | 0 | 0 | 12/16 |
| 13 | 1 | 1 | 0 | 1 | 13/16 |
| 14 | 1 | 1 | 1 | 0 | 14/16 |
| 15 | 1 | 1 | 1 | 1 | 15/16 |

FIG. 12B

FLASH MEMORY DEVICE AND ARCHITECTURE WITH MULTI LEVEL CELLS

FIELD OF THE INVENTION

This invention relates to semiconductor memories, and more particularly to multi-level memory cells.

BACKGROUND OF THE INVENTION

FLASH memory employing electrically-erasable programmable read-only memory (EEPROM) is widely used today. FLASH memory cells use a floating-gate transistor that has an electrically-insulated gate sandwiched between a control gate and a channel in the substrate between a source and a drain. Charge is injected into the floating gate through a thin tunneling oxide between the substrate and the floating gate. Since the floating gate is surrounded by insulators such as oxide, the charge remains on the floating gate after programming or erasure.

FLASH memory based on n-channel transistors are initially erased. The control gate is grounded and the Vpp programming voltage applied to the drain, reversing the electric field across the thin oxide, and causing electrons to tunnel from the floating gate to the drain. Removing electrons from the floating gate during erasure allows more of the electric field from the control gate to reach the channel during a read, increasing read current in the channel. The erased cells have full current drive and are considered a logic 1.

After erasing, the cell can be programmed by injecting electrons into the floating gate. A large, positive programming voltage Vpp is applied to the control gate, causing electrons in the channel to tunnel through the thin oxide to be captured by the floating gate. The increased negative change on the floating gate cancels some of the positive charge on the control gate, reducing the effective gate voltage reaching the channel, thus reducing channel current. A programmed cell is considered a logic 0.

Reading the state of the FLASH cell is performed by applying an intermediate voltage such as gate voltage Vg onto the control gate. The source is grounded and the drain is connected to a bit line that is sensed by a sense amplifier. When the cell is erased, the cell transistor draws current from the bit line to the grounded source, and the drop in bit-line voltage can be sensed. A programmed cell does not pull the bit-line voltage down, or at least not as quickly as the erased cell. A read operation can be performed to verify programming, and programming repeated should the cell not be programmed as much as desired.

Many FLASH memories simply program a binary 1 or 0 onto each FLASH-memory cell. This provides a wide noise margin. However, in more general cases of Multi-level Cells (MLC), the amount of charge stored on the floating gate is inherently an analog value having a range of possible values, say four, rather than just two (binary) values.

Multi-level cells have more than two logic states per memory cell. For example, a single memory cell storing two bits of information could have 4 logic states: the 11 (erased) state has the most current during a read, the 00 (fully-programmed) state has the least current, while states 01 and 10 have less current than the erased 11 state, but more current than the 00 state, with state 01 having less current than state 10 during a read. In general, a multi-level cell could have $2^N$ states or logic levels, where N is the number of binary bits of data stored by the single cell.

FIG. 1 shows a prior-art FLASH memory with a multi-level FLASH cell. Address 30 is divided into row and column addresses and decoded to select FLASH cell 20. The row address is decided by row decoder 18, which selects a row of FLASH cells by driving a reading gate voltage onto the control gate of FLASH cell 20. Column decoder 16 selects one column bit line to connect to the sense amplifier. Drain bias circuit 14 can provide a pull-up bias to the selected bit line, and bias transistor 10 functions as a column load and acts as an active resistor to the bias circuit.

Comparators 22, 26 each receive on their inverting inputs the voltage on the sensing node between transistor 10 and drain bias circuit 14. This sensing node is pulled lower by current through FLASH cell 20 and column decoder 16 when FLASH cell 20 is erased, but little or no current is drawn from this sensing node when FLASH cell 20 is programmed. Intermediate states of FLASH cell 20 draw intermediate amounts of current from the sensing node.

Reference generator 12 generates 3 reference voltages VR1, VR2, VR3 that correspond to voltages on the sensing node that are between the four possible states of FLASH cell 20. The middle reference voltage VR2 is applied to the non-inverting input of first comparator 22 to generate the most-significant-bit (MSB), D1, that can be output on line 24. When the sensing node's voltage is below VR2, comparator 22 drives a 1 that is output as the MSB result (D1) by line 24.

The MSB result from first comparator 22 is fed back to reference generator 12. When the MSB result is 1, lower reference voltage VR1 is applied to the non-inverting input of second comparator 26. When the sensing node's voltage is below VR1, second comparator 26 drives a 1 that is output as the LSB result (D0) by line 28. The state of FLASH cell 20 is then 11, the fully-erased state that draws the most current from the bit lines and sensing node. When the sensing node's voltage is above VR1, second comparator 26 drives a 0 that is output as the least-significant-bit (LSB) result (D0) by line 28. The state of FLASH cell 20 is then 10, the partially-erased state that draws somewhat less current from the bit lines and sensing node than the fully-erased state.

When the MSB result fed back is 0, upper reference voltage VR3 is applied to the non-inverting input of second comparator 26. When the sensing node's voltage is below VR3, second comparator 26 drives a 1 that is output as the LSB result (D0) by line 28. The state of FLASH cell 20 is then 01, the partially-programmed state that draws somewhat more current from the bit lines and sensing node than the fully-programmed state, but less current than the partially-erased state 10. When the sensing node's voltage is above VR3, second comparator 26 drives a 0 that is output as the LSB result (D0) by line 28. The state of FLASH cell 20 is then 00, the fully-programmed state that draws the least current from the bit lines and sensing node than the fully-erased state.

FIG. 2 is a graph of 4 states of a multi-level cell and intermediate reference voltages. The control-gate voltage Vg required to turn on the FLASH cell is shown on the x-axis. A fully-programmed cell, state 00, has the most electrons in its floating gate, and thus requires the highest gate voltage to turn on to a specified channel current. A fully-erased cell, state 11, has the fewest electrons in its floating gate, and requires the smallest Vg to turn on. Plots of bit-line and sense-line voltages can be similar to this plot using Vg under certain biasing conditions.

Middle reference voltage VR2 is between partially-erased state 10 and partially-programmed state 01. Lower reference voltage VR1 is between erased states 11 and 10, while upper reference voltage VR3 is between programmed states 01 and 00. For example, when Vcc is 3.3 volts, VR1 could be 1.3 volts, VR2 is 2.3 volts, and VR3 is 2.7 volts.

The y-axis shows the cell's Vt (threshold voltage) state strength. The strength or safety margin of a Vt-state is greatest when the Vt is half-way between adjacent reference voltages. Upper and lower limits for each Vt-state may be specified. For example, erased state 11 is between lower limit VL0 and upper limit VU0. State 10 is between lower limit VL1 and upper limit VU1. Reference voltage VR1 is between upper limit VU0 of state 11 and lower limit VL1 of state 10. During programming or erasure, the FLASH cell Vt is targeted to fall between upper and lower limits of a desired state. This provides a small margin to the nearest reference voltage, such as a margin of VR1–VU0 for state 11.

FIG. 3 is a flowchart of a binary-search reference-voltage comparison for a multi-level FLASH cell. Initially the sensing node is compared to the middle reference voltage VR2, step 44, by the first comparator. When the sensing node is below VR2, the MSB is 1, when the sensing node is above VR2, the MSB is 0.

When the sensing node is below VR2, the lower reference voltage VR1 is applied to the second comparator for comparison to the sensing node, step 46. When the sensing node is below VR1, step 50, the state is 11; when the sensing node is above VR1, step 52, (but below VR2 from step 44), the state is 10.

When the sensing node is above VR2, the upper reference voltage VR3 is applied to the second comparator for comparison to the sensing node, step 48. When the sensing node is above VR3, step 56, the state is 00; when the sensing node is below VR3, step 54, (but above VR2 from step 44), the state is 01.

The voltage comparisons in step 44 by the first comparator must be performed before the voltage comparison of either step 46 or step 48 by the second comparator. This causes a delay of 2*Ts, where Ts is the sensing-comparator delay. When the number of states is 8, another level of comparison is required, for a total of 3 levels or a delay of 3*Ts. In general, for a FLASH cell storing N bits, having $2^N$ possible states, an N-level comparison is needed, producing a comparison delay of N*Ts.

Variations in fabrication processes and aging of the device may cause shifts in the threshold of the FLASH cell transistors. These shifts can weaken the cell state strength by moving the cell closer to the next reference voltage. As more levels are squeezed into a fixed supply-voltage range, the allowable margins for these shifts decreases. Reference voltages may have to be adjusted for these shifts.

More precise programming are performed by applying successively higher Vpp programming voltages to cells. After each successively-higher programming, the cells are verified to see if a target sensing voltage is reached. Programming can continue with a higher programming voltage until the target is reached.

While the binary-search comparison of reference voltages to the sensing node is useful, the sequential nature of such comparison introduces more delays as the number of levels per cell increases. What is desired is a single-pass comparator for sensing among multiple levels of a multi-level FLASH-memory cell.

SUMMARY OF THE INVENTION

A flash memory has an array of FLASH cells that each store N multiple bits of information as charge stored on a floating gate. Reference voltages or currents are generated for each boundary between the $2^N$ states or levels and for an upper limit and a lower limit reference for each state. A selected bit line driven by a selected FLASH cell generates a sense node that is compared to a full range of $3*2^N-1$ comparators in parallel. The compare results are decoded to determine which state is read from the selected FLASH cell. An in-range signal is activated when the sense node is between the upper and lower limit references. The target programming count or programming pulses is adjusted during calibration to sense in the middle of the upper and lower limit references. Margin between references is adjusted by calibration codes that select currents for summing.

BRIEF DESCRIPTION OF THE DRAWINGS

FIG. 6 is a table comparing access times.

FIG. 10 is a truth table showing decoding by the sense-amplifier translation logic.

FIG. 11 is a truth table of comparing write-cache data to read data.

FIG. 12A is a table showing generation of reference currents by successively adding delta currents.

FIG. 12B is a calibration-code table showing delta currents generated for each code.

DETAILED DESCRIPTION

The present invention relates to an improvement in multi-level cells. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4A:
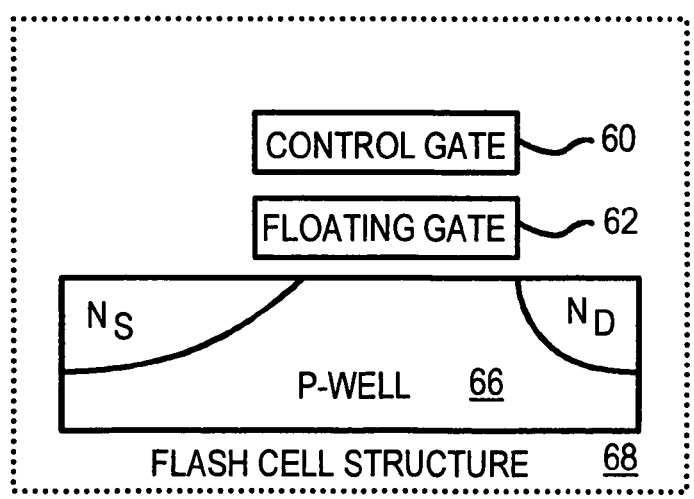
FIG. 4A shows a FLASH-memory transistor.

FIG. 4A shows a FLASH-memory transistor. A FLASH cell can have just transistor 68, or can also have a select transistor in series between the bit line and the drain. Control gate 60 is connected to a word (row) line, while floating gate 62 is isolated from all other nodes by insulators such as oxides. A thin tunneling oxide between floating gate 62 and P-well substrate 66 allows electrons to flow between floating gate 62 and substrate 66. The thin oxide can occur over the N+ drain or the channel.

During erasure, electrons are removed from floating gate 62, allowing positive charges on control gate 60 during a subsequent read to reach substrate 66, forming a conducting channel between the drain and source. The source is normally grounded while the drain is connected to the bit line. The channel current drains the bit line, lowering its voltage.

When programmed, electrons are injected into floating gate 62, canceling or blocking positive charges on control gate 60 during a subsequent read from reaching substrate 66. The conducting channel between the drain and source is reduced or eliminated, reducing or blocking channel current. The small channel current barely drains the bit line, allowing its voltage to remain high.

Figure 4B:
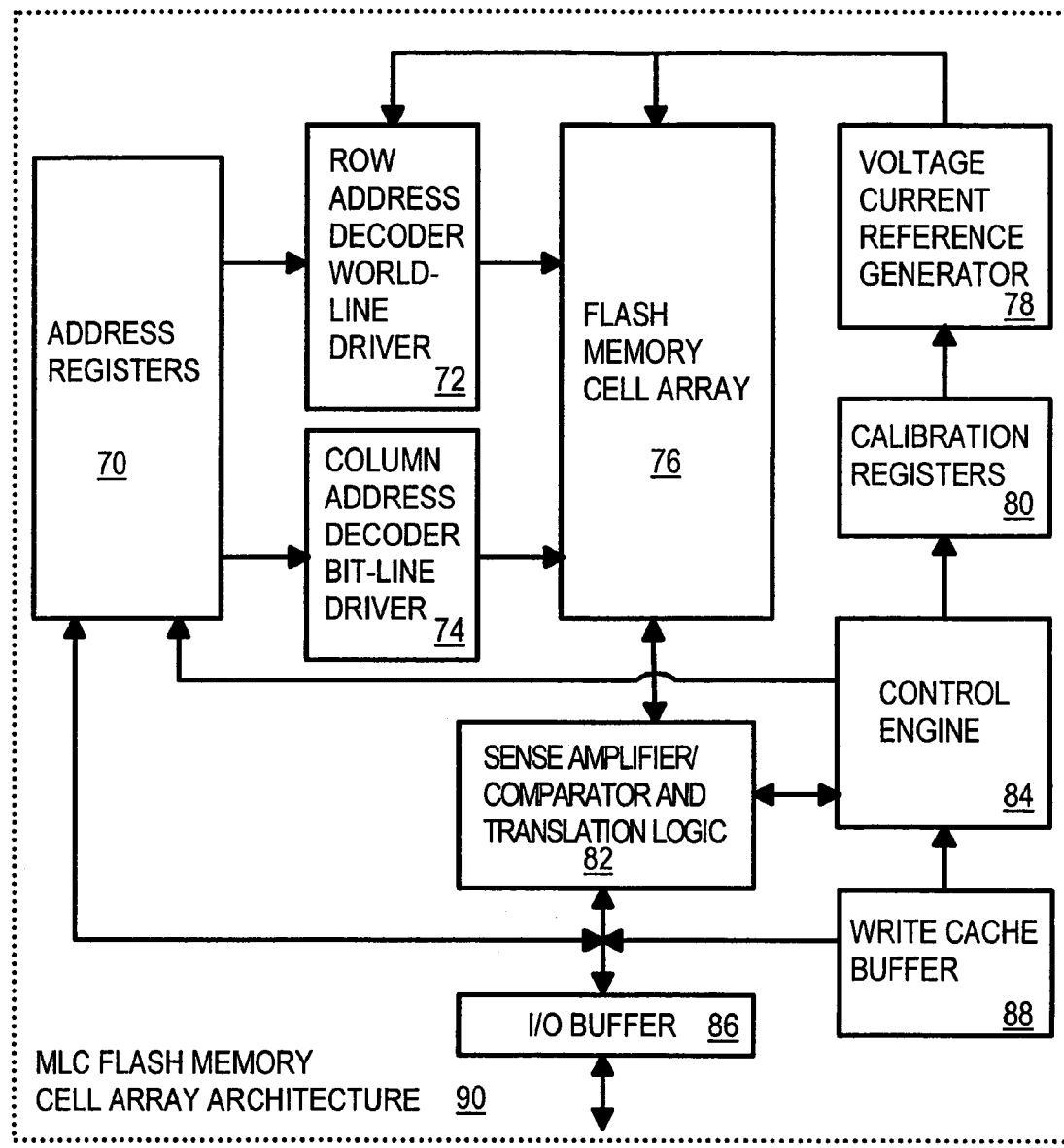
FIG. 4B is a block diagram of a FLASH-memory architecture.

FIG. 4B is a block diagram of a FLASH-memory architecture. FLASH cells are arrayed in rows and columns in FLASH-memory cell array 76. Addresses applied to FLASH architecture 90 are buffered by I/O buffer 86 and loaded into address registers 70. Row address bits are decoded by row decoder-drivers 72 which drive a selected row line and the control gates of FLASH cells in array 76 with the Vpp programming voltage during programming, or the read voltage (such as Vcc or an intermediate voltage VL0) during a read or read-verify operation.

Column decoder 74 decode column address bits, activating one or more bit lines in a column in array 76. The selected bit lines are biased and connected to the sensing nodes of sense amplifiers 82 when reading data in the memory cells. Each selected bit line is connected to a sensing node that connects to a bank of comparators having differing reference voltages. Translation logic determines which of the multiple states is stored in the activated cell in the selected bit line. The multi-bit data are then output to I/O buffers 86. These may be several banks of comparators in parallel to allow wider reads, such as byte or word-wide reading.

Data to be programmed into array 76 can be temporarily stored in write cache 88 before being applied to write-column drivers by control engine 84. Control engine 84 controls operations such as read, erase, program, and calibration.

Calibration registers 80 are updated with calibration values that adjust reference voltages or currents generated by reference generator 78. These reference voltages are used for a variety of circuits, such as by bit line biasing transistors in array 76, or word-line drivers in row decoder-drivers 72. Calibration allows for adjustment of reference voltages used by sense amplifiers 82 to determine states of memory cells being read.

Figure 5:
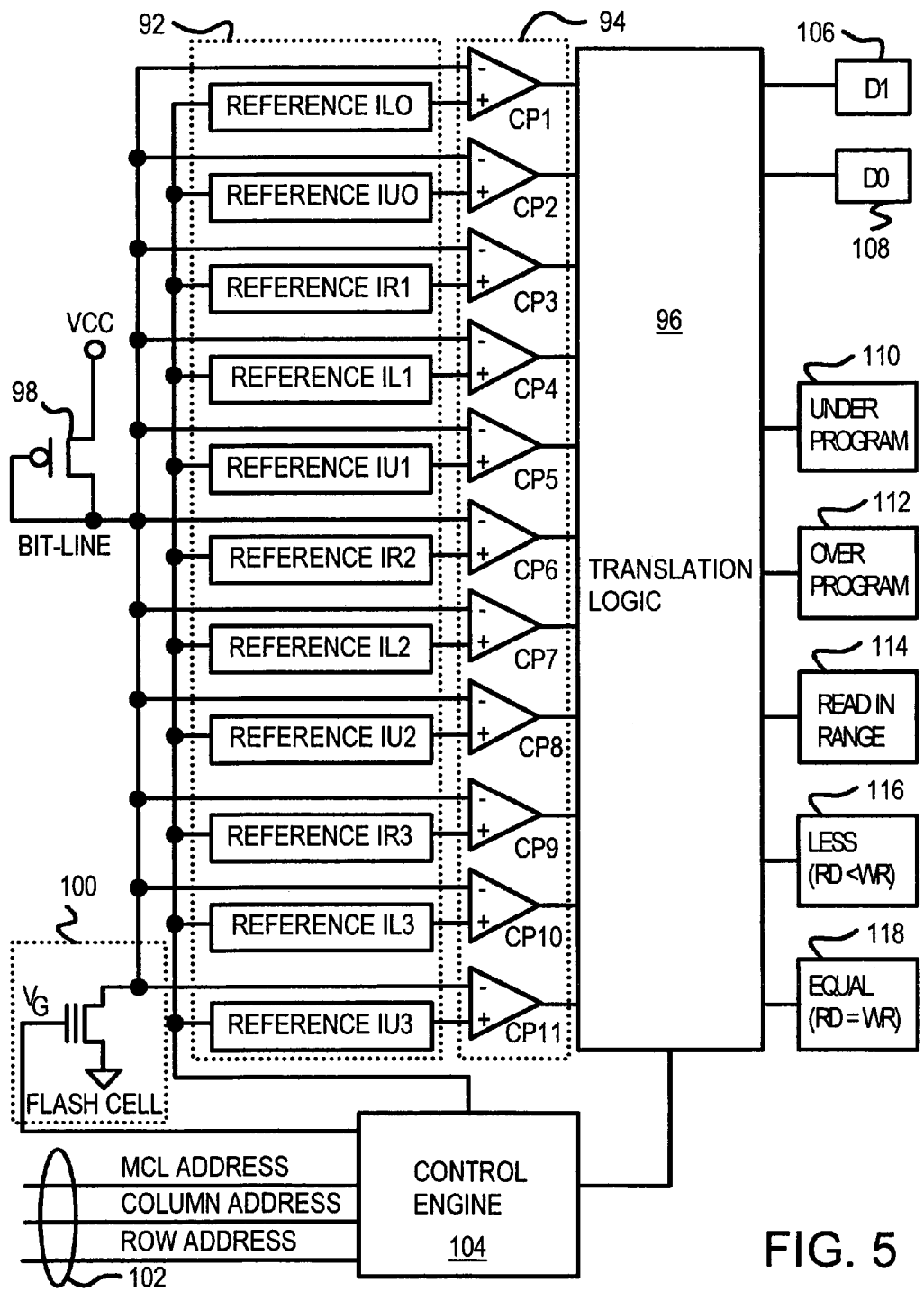
FIG. 5 shows a full-spectrum sense amplifier for reading and verifying multi-level FLASH cells.

FIG. 5 shows a full-spectrum sense amplifier for reading and verifying multi-level flash FLASH. Address 102 is decoded under control of control engine 104. The row address causes one row to be activated by driving a read voltage onto the control gates of cells in the row, including FLASH cell 100. The column address is decoded to activate sense amplifiers in one column, such as reference generators 92. The actual reference voltages could be generated elsewhere and coupled to the non-inverting inputs to comparators 94 by pass transistors or other coupling logic in reference generators 92.

The drain of FLASH cell 100 is coupled to a bit line that is biased by column-load transistor 98. Column-selecting transistors (not shown) could be placed between FLASH cell 100 and the inverting inputs to comparators 94.

Rather than have just one reference voltage per memory bit, there are $2^N-1$ references per Nbits, each VT-state has 3 reference voltages, for a total of $(3*2^N)-1$ references. For example, state 11 has upper-limit reference voltage VU0 and lower-limit reference voltage VL0 and boundary reference voltage VR1, which is the boundary voltage between states 11 and 10. The programming target for each state is for FLASH cell 100 produce a sensing voltage between the upper and lower limits for that state when read.

A total of 11 comparators are used in comparators 94, and a total of 11 different reference voltages are applied to these 11 comparators by reference generators 92. The sensing node's voltage is compared to a full spectrum of reference voltages by comparators 94. Translation logic 96 decodes the outputs from comparators 94 to determine the state of FLASH cell 100 being read. MSB line 106 is loaded with the MSB, while LSB line 108 is loaded with the LSB from translation logic 96.

Additional information is available beyond which of the 4 possible states FLASH cell 100 is storing. By comparing the sensing node to upper and lower limits for each state, it can be determined when FLASH cell 100 is over-programmed or under-programmed.

FLASH cell 100 is under-programmed when its sensing voltage is below the state's lower limit, but above the boundary reference voltage to the next state. Under-program line 110 can be set when under-programming is detected by translation logic 96.

FLASH cell 100 is over-programmed when its sensing voltage is above the state's upper limit, but below the boundary reference voltage to the next state. Over-program line 112 can be set when over-programming is detected by translation logic 96.

When the sensing node's voltage for selected FLASH cell 100 is between the upper and lower voltage limits for a state, the cell is properly programmed within the limits. In-range line 114 can be set. Over-programmed and under-programmed cells are still functional, but may have longer-term reliability problems since they are close to the state boundary voltages and could shift into the wrong state over time.

During a read-verify operation after programming, the data bits in lines 106, 108 are compared to the write data in the write cache. When the data bits in lines 106, 108 (the current state of FLASH cell 100) match the write cache data (the desired data), programming has been successful. Equal line 118 can be set to indicate successful data validation.

When the data bits in lines 106, 108 (the current state of FLASH cell 100) do not match the write cache data (the desired data), programming has not been successful. Additional programming is performed by increasing the programming voltage Vpp. Further programming may increase the negative charge in the floating gate sufficiently to get the sensing node voltage within the desired state's limits. LESS line 116 is set when the cell's current state bits in lines 106, 108 are less than the write-cache data bits.

When the cell's current state bits in lines 106, 108 are smaller than the write-cache data bits, the cell has been over-programmed into the next state. Further programming will not correct the problem since the cell needs to be erased and re-programmed. An error flag (not shown) can be set when this situation is detected.

Figure 1:
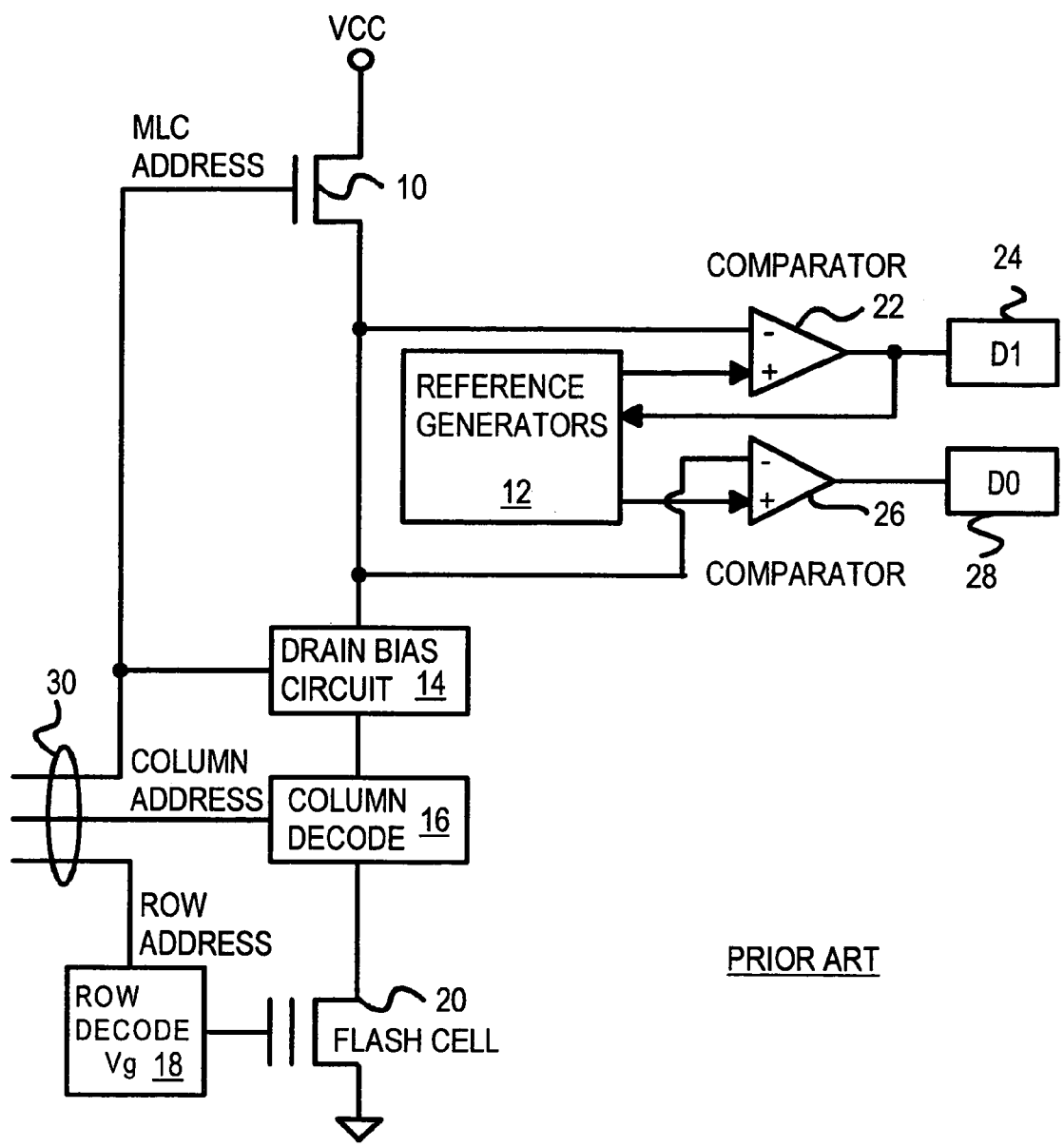
FIG. 1 shows a prior-art FLASH memory with a multi-level FLASH cell.
Figure 2:
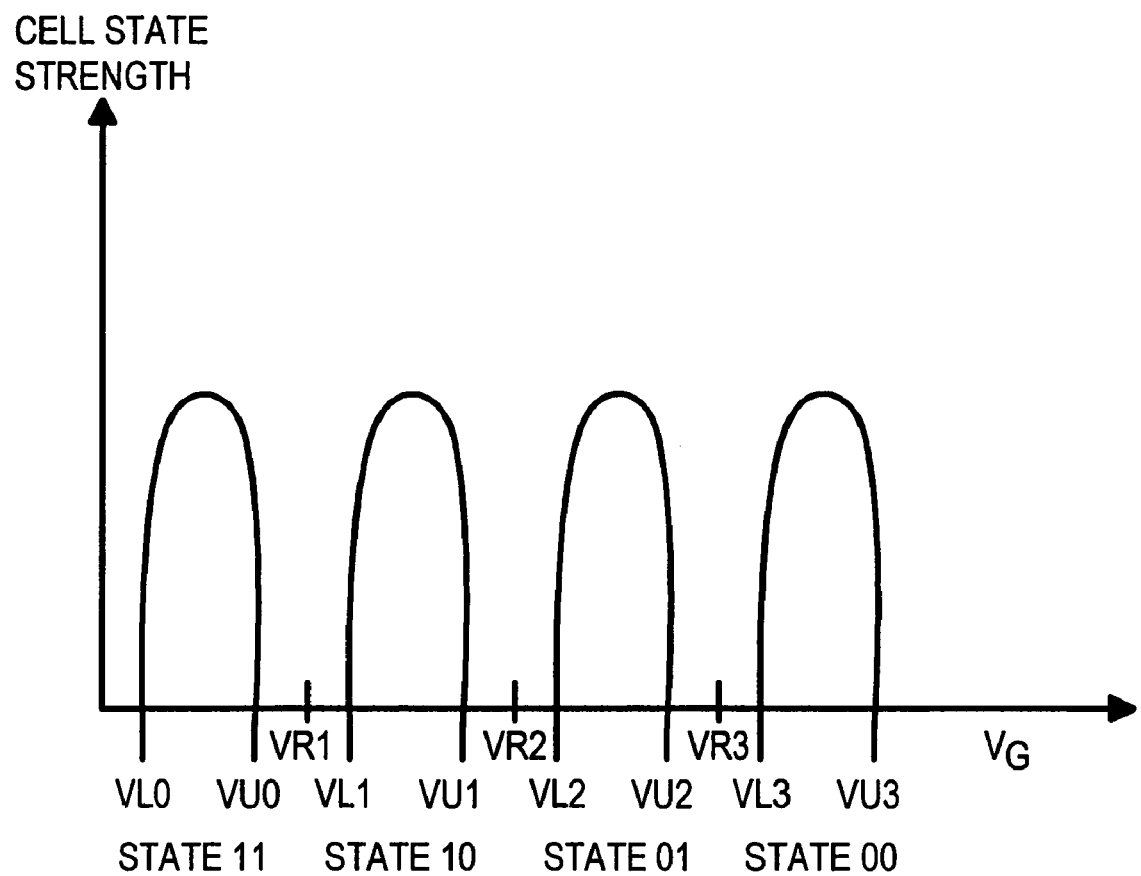
FIG. 2 is a graph of 4 states of a multi-level FLASH cell and intermediate reference voltages.
Figure 3:
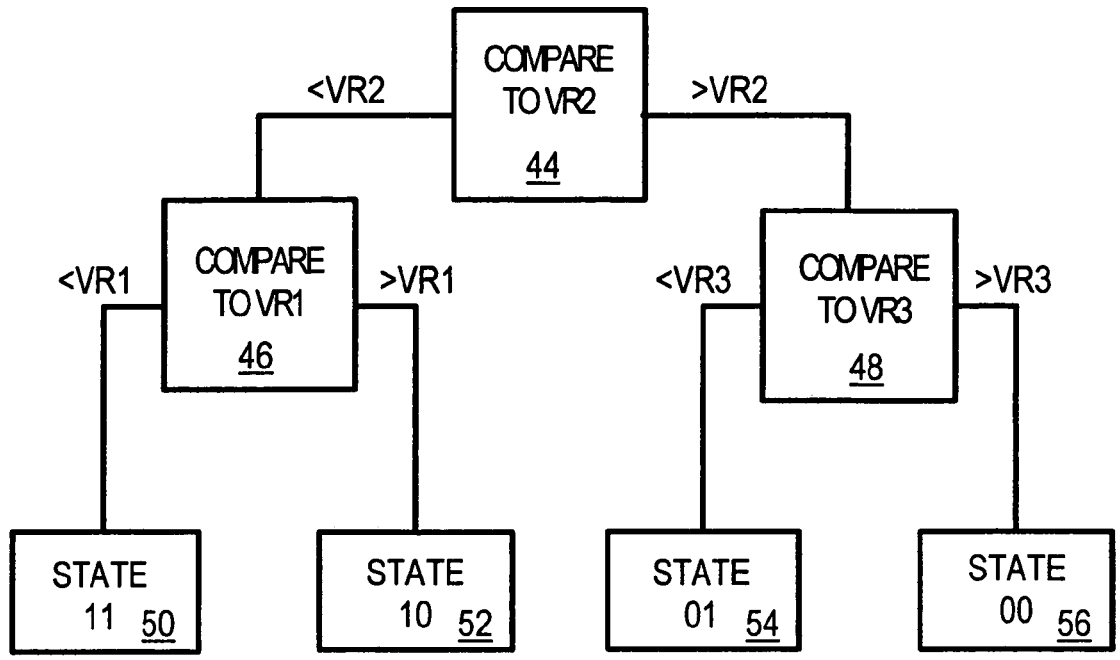
FIG. 3 is a flowchart of a binary-search reference-voltage comparison for a multi-level FLASH cell.

FIG. 6 is a table comparing access times. When a binary-search comparison is performed, such as for the prior art of FIGS. 1–3, the read access time includes one comparator delay for each bit stored per FLASH cell. For example, a 2-bit cell has 2 comparator delays, and a total access time of Tc+2Ts+Tr, where Tc is the cell access time and Tr is the delay through the translation logic.

Since comparison is performed in parallel by the sense amplifier of FIG. 5, a single pass through the sense amplifier is sufficient to compare the sensing node to all 11 reference voltages. Thus only one comparator delay occurs when using full-spectrum sensing, regardless of the number of bits stored per FLASH cell. The access time is Tc+Ts+Tr. Of course, the translation-logic delays may be larger when more states are decoded, and additional loading of the bit lines by the additional comparators may add some other delays.

Figure 7:
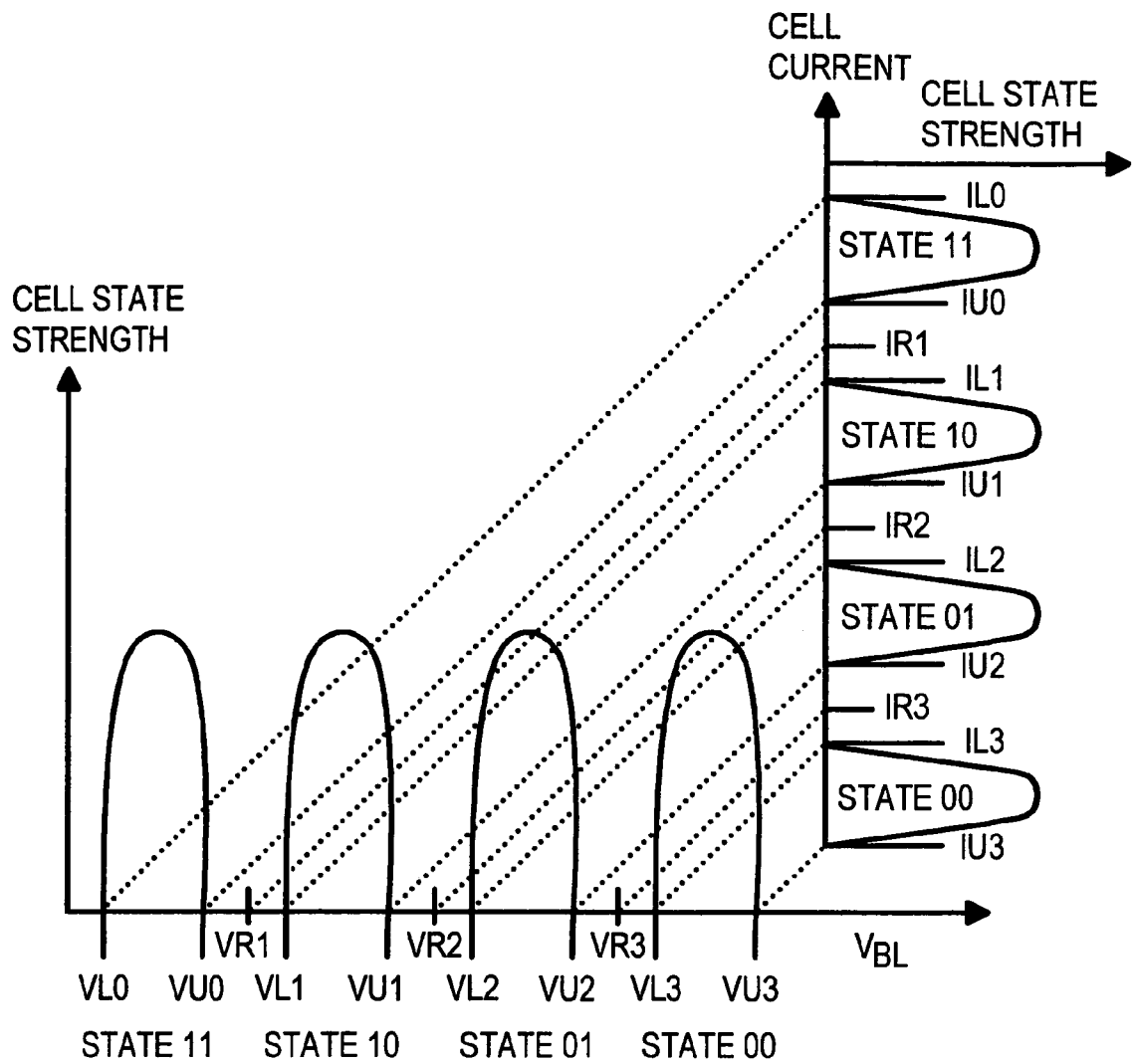
FIG. 7 is a graph of states and sensing currents of a multi-level FLASH cell and intermediate and limit reference voltages.

FIG. 7 is a graph of states and sensing currents of a multi-level FLASH cell and intermediate and limit reference voltages. The bit-line voltage $V_{BL}$ produced when reading the cell is shown on the x-axis. The control-gate voltage Vg required to turn on the FLASH cell to a specified channel current would have a similar plot. A fully-programmed cell, state 00, has the most electrons in its floating gate, and thus requires the highest gate voltage to overcome the negative charge in the floating gate and turn on the channel to a specified channel current. A fully-erased cell, state 11, has the fewest electrons in its floating gate, and the cell is in depletion mode.

Middle reference voltage VR2 is between partially-erased state 10 and partially-programmed state 01. Lower reference voltage VR1 is between erased states 11 and 10, while upper reference voltage VR3 is between programmed states 01 and 00. For example, when Vcc is 3.3 volts, VR1 could be 1.3 volts, VR2 is 2.3 volts, and VR3 is 2.7 volts.

Each state has two limit voltages that indicate the target voltage range for the state. State 11 has lower limit VL0 and upper limit VU0, while state 10 has lower limit VL1 and upper limit VU1. State 01 has lower limit VL2 and upper limit VU2, while state 00 has lower limit VL3 and upper limit VU3.

The y-axis shows the cell's VT state strength. The strength of a state is greatest when it is half-way between adjacent reference voltages. Cells that are outside the limits still function, but may drift into the next state over time or usage and thus have lower reliability.

The sensing currents pulled by the FLASH cell from the bit line and sensing node have an inverse relationship to the programmed control-gate voltage. For example, state 11 produces the largest sensing current since it is the least programmed (fully erased) state, having the least negative charge on its floating gate, requiring the smallest Vg. Fully-programmed state 00 has the most electrons on the floating gate, has the largest Vg, and produces the least sensing current for a given gate and drain bias.

Figure 8:
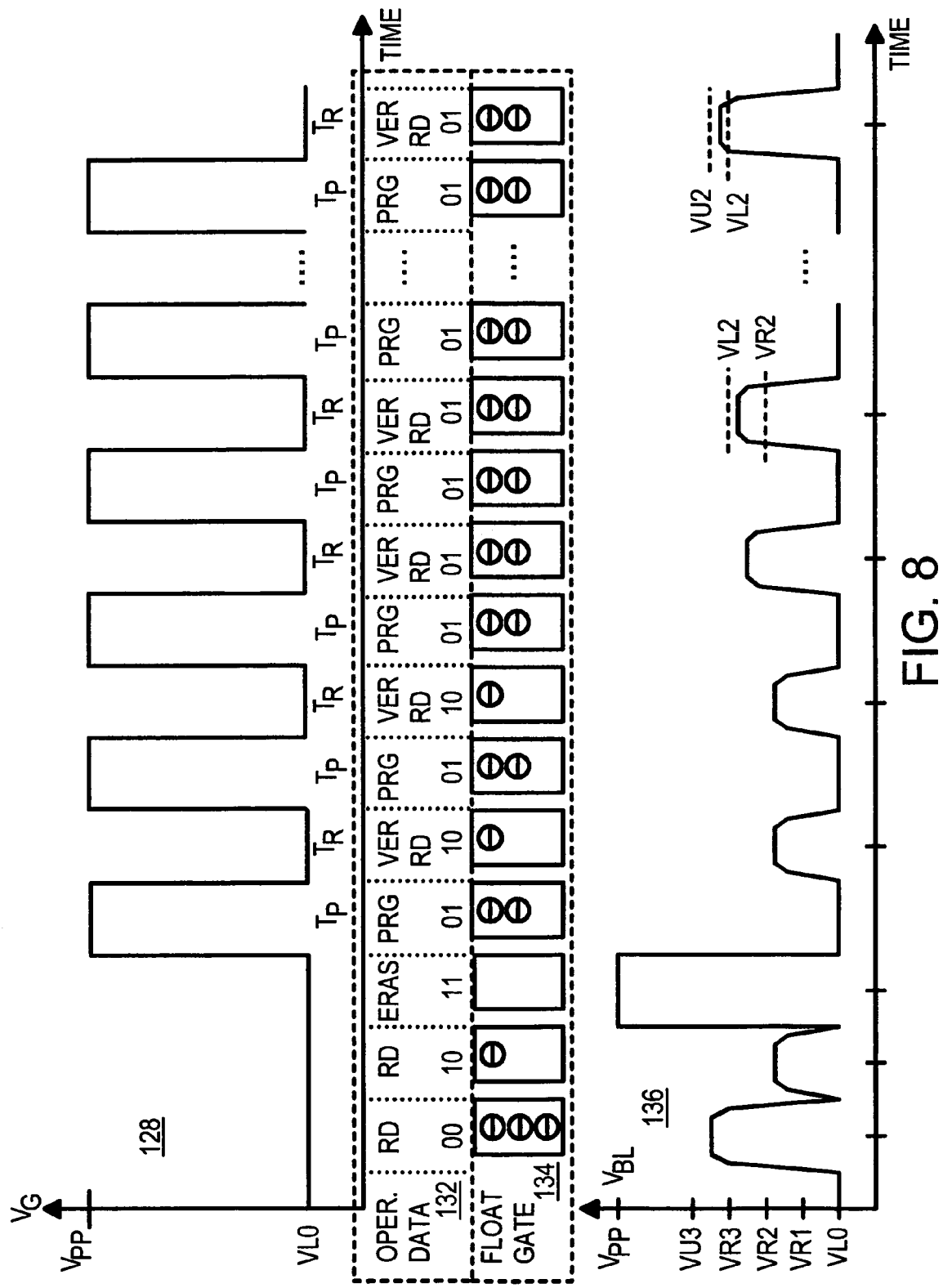
FIG. 8 is a diagram and graphs illustrating a sequence of read, erase, programming, and read-verify cycles.

FIG. 8 is a diagram and graphs illustrating cell operation of an embodiment for a sequence of read, erase, programming, and read-verify cycles. Upper graph 128 shows the gate voltage of a selected FLASH memory cell over time, while lower graph 136 shows the bit-line voltage of a selected FLASH memory cell over time. The selected bit-line voltage is similar to the voltages on the sensing-node and the drain of the selected FLASH cell transistor.

Operations 132 shown along the y-axis are a sequence of operations starting with reads of two different FLASH cells, an erase, and then a series of programming and read-verify operation pairs. The negative charge on the selected FLASH cell's floating gate is shown after each operation as floating gate charge 134.

The first operation is a read of a cell in the fully-programmed, 00 state. The floating gate has the most negative charge, so when read voltage VL0 is applied to the control gate in upper graph 128, the resulting bit-line and sensing-node voltage in lower graph 136 is above reference voltage VR3 but below upper-limit voltage VU3. From FIG. 7, this sensing voltage is read as state 00.

The second operation is a read of a cell in the partially-erased state 10. This cell has less negative charge on its floating gate, and produces a larger read current, pulling the bit-line and sensing node to a lower voltage. When read voltage VL0 is applied to the control gate in upper graph 128, the resulting sensing-node voltage in lower graph 136 is between reference voltages VR1 and VR2. From FIG. 7, this sensing voltage is read as state 10.

The selected cell is next erased in the third operation. Vpp is applied to the drain through the bit-line. The sensing node itself may be disconnected from the bit-line when Vpp is applied to protect the sense amplifier. The voltage VL0, or ground, is applied to the control gate of the selected FLASH cell. Negative charge is removed from the floating gate during the erase. Many cells can be erased in parallel using a FLASH-erase operation.

The erased cell is programmed in the fourth operation. The write-cache data to program into the cell is 01, one of the partially programmed state. The programming voltage Vpp is applied to the control gate for a programming time period Tp, while the bit-line is kept at a low voltage such as ground or VL0. Charge is injected into the floating gate during programming.

A read-verify operation is performed immediately after the programming operation, on-the-fly. The control gate voltage is dropped from Vpp to the normal read voltage VL0, and the bit-line is pulled up by the bias current until it sinks into the FLASH cell. The sensing-node voltage is between VR1 and VR2, which indicates state 10. Since the data in the write cache is 01, the data mismatches and the read-verify fails. Since the read current 10 is greater than the write data 01, less line 116 (FIG. 5) is unset. The control engine performs another programming operation to try to increase the charge in the floating gate to reach state 01.

Programming is repeated by raising the control-gate voltage to Vpp for a further time Tp, or some other time period, while the bit-line is grounded or sit at VL0. Then another on-the-fly read-verify is performed. The control gate voltage is lowered to VL0, the bit-line bias is activated and connected to the sense amplifier. The sensing-node voltage may rise somewhat, but again falls between VR1 and VR2, indicates state 10. The data again mismatches and less line 116 is unset.

A third programming operation is performed on the FLASH cell. During the read-verify operation that follows, the sensing voltage has risen and is now between VR2 and VR3. This is the intended state 01. The write-cache data matches the read-verify data, so equal line 118 (FIG. 5) is set. However, the sensing voltage is not between the target limits VL2 and VU2 (FIG. 7). Instead, the sensing voltage is between VR2 and VL2. The FLASH cell is still under-programmed, so under-program line 110 is set.

The control engine performs another programming operation to try to increase the charge in the floating gate to reach the middle of state 01, between target limits VL2 and VU2. During the read-verify operation that follows, the sensing voltage has risen and is now between VR2 and VR3. This is the intended state 01. The write-cache data matches the read-verify data, so equal line 118 (FIG. 5) is set. However, the sensing voltage is still not between the target limits VL2 and VU2. Instead, the sensing voltage is between VR2 and VL2. The FLASH cell is still under-programmed, so under-program line 110 is again set.

Pairs of programming and read-verify operations can continue until the sensing voltage finally falls within the target limits VL2 and VU2. The final programming operation causes the sensing voltage to fall between target limits VL2 and VU2 during the last read-verify operation. Then both equal line 118 and in-range line 114 are set, ending the series of programming and verify operations.

If the programming were to over-shoot the target range, an error would be signaled. Thus the programming time Tp may be decreased when nearing the target range, such as when equal line 118 is set.

Figure 9:
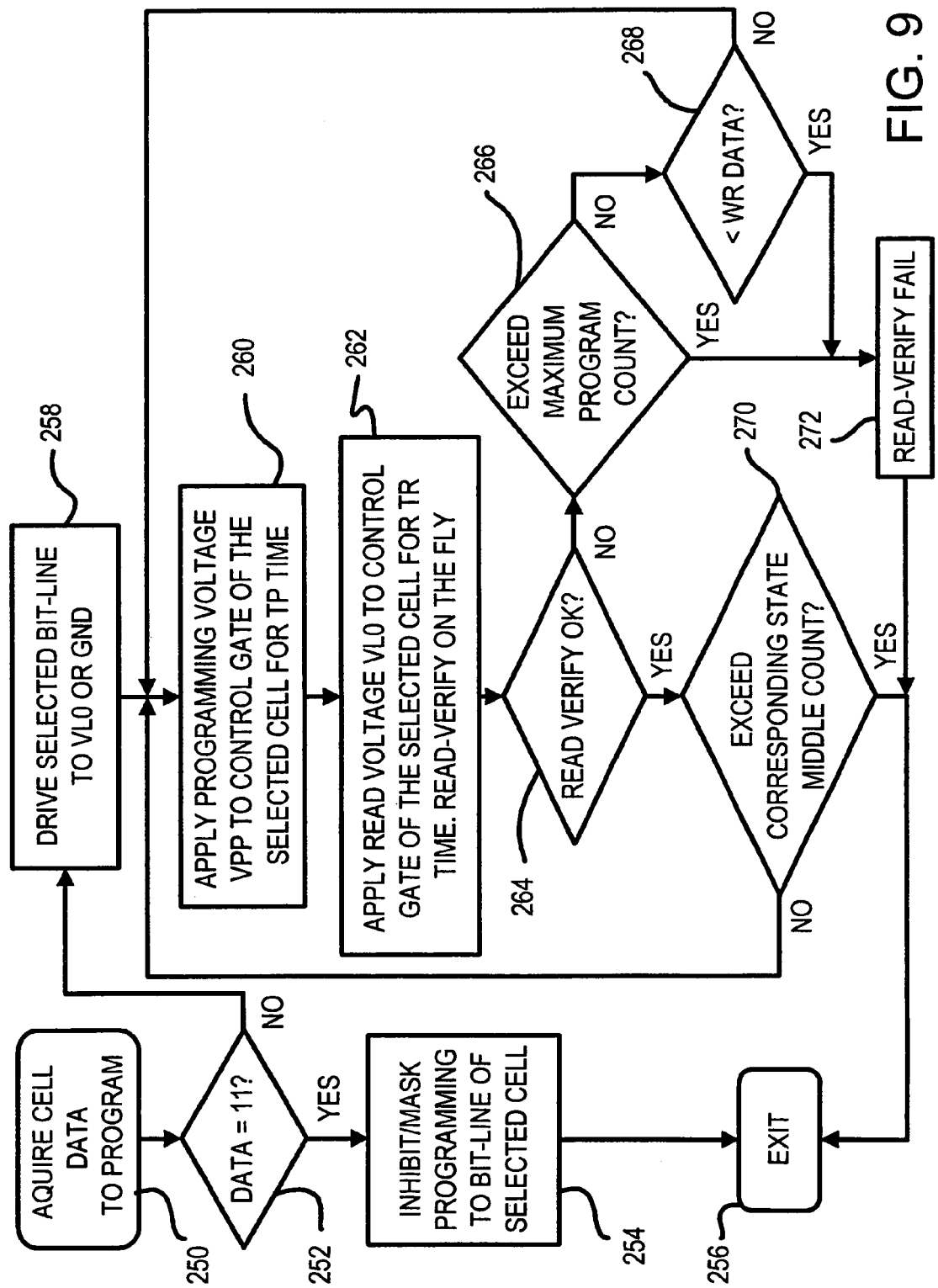
FIG. 9 is a flowchart of programming and verify operations.

FIG. 9 is the flowchart of programming and verify operations. The selected FLASH-memory cell is in the erased state before the process begins. The data to program is loaded into the write cache, step 250. If the write data is 11, step 252, programming for that cell and bit-line is inhibited by setting a flag or a mask bit, step 254. Other cells could still be programmed when performing parallel writes. The fully erased state corresponds to data 11, so no further programming is necessary when the write data is 11. The cell is already in the desired state.

When the write data is not 11, step 252, the address is decoded and the selected bit-line is driven to ground or a low voltage VL0, step 258. The source is always at ground, and the drain of the cell being programmed is thus driven low. Voltage VL0 could be ground or could be a higher bias voltage such as the lowest reference voltage.

The programming voltage Vpp is applied to the selected row line, step 260. This applies Vpp to the control gate of the selected FLASH cell transistor, for the programming time period Tp. Electrons are injected (CHI mode) or tunneled (FNT mode) into the floating gate, increasing Vt and reducing the cell's read current. More charge is injected into the floating gate for longer periods of time Tp.

A read-verify operation is performed by lowering the row voltage from Vpp to the read voltage VL0, step 262. The bit-lines are connected to the sense amplifiers and the bit-line bias transistors activated. The sensing node voltage is compared to all 11 voltage references to determine the data read back, and how the sense voltage fits within the target limits within each Vt state.

When the read data matches the write-cache data, for that state, step 264, then verification passes. Additional programming pulses are applied (step 260) until the middle count for the state is reached, step 270. Then programming will end, step 256.

When the data does not match, step 264, and if the maximum allowed count of programming cycles has not yet been reached, step 266, then further programming may allow the desired state to be reached. The current read value must be more than the value of the write-cache data, since cells can only be programmed further, not erasing to compensate for over-programming. If the read current is less than the write current, step 268, then read-verification fails, step 272.

When the read current is greater than or equal to the write data, step 268, then programming can be repeated from step 260 until the data matches and the sense voltage falls within the target limits.

Each data state has its own lower count, middle count and maximum count. The middle count is the estimated number of programming pulses to reach the middle of the range, halfway between the upper and lower limits of that state. The maximum count is a maximum number of programming pulses before an over-program status is signaled. The middle count can be determined by calibration testing. One or more memory cells are programmed to the desired state, and the number of programming pulses to reach the lower limit is recorded. Then programming continues until the state's upper limit is reached. The average of the number of pulses required to reach the upper and lower limits is the middle count.

Calibration testing can be performed at any time during the life of the memory. As the memory cells age, the mid points of the states may drift. Re-calibration allows the mid-point counts to be updated as needed. For example, re-calibration could be performed every million writes, or once a year.

FIG. 10 is a truth table showing decoding by the sense-amplifier translation logic. The translation logic are implemented by logic gates using the logical inputs (columns IL0 to IU3) and outputs (last 5 columns) of the table.

The sensing-node voltage is compared to a full spectrum of reference voltages, including boundary reference voltages between states, and upper and lower target voltages within each state. For FLASH cells storing 2 bits (N=2), there can be 11 comparator results fed into the translation logic. These comparator outputs are 1 when the sensing-node voltage is below the reference, but 0 when above the reference. The reference voltage or reference current for each comparator is shown across the top row of the table for columns 2–12, IL0 corresponding to VL0, IU0 corresponding to VU0, IR1 corresponding to VR1, etc.

The translation logic decodes the 11 inputs from the 11 comparators to generate the logic state represented by the sense voltage, RD-D1 and RD-D0. These are the read data values. Further information is also generated, such as the in-range bit that is set when the sense voltage is between the upper and lower limits for a state, the over-limit bit set when the sense voltage is above the upper limit but below the next boundary reference voltage, and the under-limit bit set when the sense voltage is below the upper limit but above the next lower boundary reference voltage.

A total of 12 sub-states are possible, shown by the rows in the table. Fully-erased state 11 (D1, D0) occurs for read sub-states 1, 2, 3. The sense voltage is below VR1. Partially-erased state 10 (D1=1, D0=0) occurs for read sub-states 4, 5, 6 when the sense voltage is below VR2 but above VR1. Partially-programmed state 01 (D1=0, D0=1) occurs for reads 7, 8, 9, when the sense voltage is below VR3 but above VR2. Fully-programmed state 00 (D1, D0) occurs for read sub-states 10, 11, 12 when the sense voltage is above VR3.

In-range sub-states 2, 5, 8, 11 occur when the sense voltage is between lower and upper limit voltages for a state, such as between VL3 and VU3 for sub-state 11. Under-limit sub-states 1, 4, 7, 10 occur when the sense voltage is below the lower limit voltage for a state, such as between VR3 and VL3 for sub-state 10. Over-limit sub-states 3, 6, 9, 12 occur when the sense voltage is above the upper limit voltage for a state, such as above VU3 for sub-state 12.

FIG. 11 is a truth table of comparing write-cache data to read data. The read data bits RD-D1, RD-D0 are generated by the translation logic from the 11 comparator outputs. The write-cache data bits WR-D1, WR-D0 are the data to be programmed into the FLASH-memory cell. These are the 4 inputs to the verify-state logic represented by the truth table.

The outputs generated are EQUAL and LESS. EQUAL corresponds to the data stored by equal line 118. LESS corresponds to the data stored by LESS line 116.

When the read data matches the write-cache data, EQUAL is set. The newly-programmed cell read back the correct data. However, when the read sensing voltage is less than the write-cache reference voltage, LESS is set. LESS indicates an error, since further programming cycles cannot remove charge from the floating gate to reach the intended states. The cell must be erased and re-programmed. The programming operation over-shot the intended state.

Reference Voltage/Current Generators

The 11 reference voltages applied to the 11 comparators are designated as reference nodes (RN) in the following figures. For example, reference node RN-IU3 can be applied to the non-inverting input of the comparator that compares the sensing-node voltage to voltage VU3.

The reference with the smallest current is RN-IU3, as can be seen in FIG. 7. Other references have larger currents and are generated by adding delta currents to the base current. For example, the second reference VL3 can be generated by adding base current IU3 to a delta current DELTA(IL3), or IL3=IU3+DELTA(IU3). The next reference current IR3 is generated by adding another delta current, DELTA(IR3), to the prior current IL3, or IR3=IL3+DELTA(IR3). Other successively-larger reference currents can likewise be generated by adding a delta current to the prior reference current. FIG. 12A is a table showing generation of reference currents by successively adding delta currents.

The delta currents do not have to be fixed, nor do they have to be the same increment. Some reference currents could be spaced closer together while other reference currents are spaced farther from their neighboring reference currents. The delta currents may be adjusted by adjusting calibration codes. Each delta current has a calibration code that determines how larger the delta current is.

FIG. 12B is a calibration-code table showing delta currents generated for each code. Currents from ratioed transistors are summed to generate the new reference current. The channel widths of the ratioed transistors are multiples of the smallest channel. For example, transistor QP34 has the smallest channel width of 1, transistor QP33 has a channel width of 2, QP32 has a channel width of 4, and QP31 has a channel width of 8. The drain currents of transistors QP34, QP33, QP32, and QP31 are $\frac{1}{16}$, $\frac{1}{8}$, $\frac{1}{4}$, and $\frac{1}{2}$ of a full drain current.

For example, for calibration code 3, currents from transistors QP33 and QP34 are summed, or $\frac{1}{8}+\frac{1}{16}=\frac{3}{16}$ of the full drain current is selected by code 3. For calibration code 11, currents from transistors QP31, QP33, and QP34 are summed. Code 4 thus generates a delta current of $\frac{1}{2}+\frac{1}{8}+\frac{1}{16}=\frac{11}{16}$ of the full drain current.

Currents from $\frac{1}{16}$ to $\frac{15}{16}$ of the full drain current can be selected by a 4-bit calibration code. Each delta current can have its own calibration code, so that each delta current can be separately adjusted.

Figure 13:
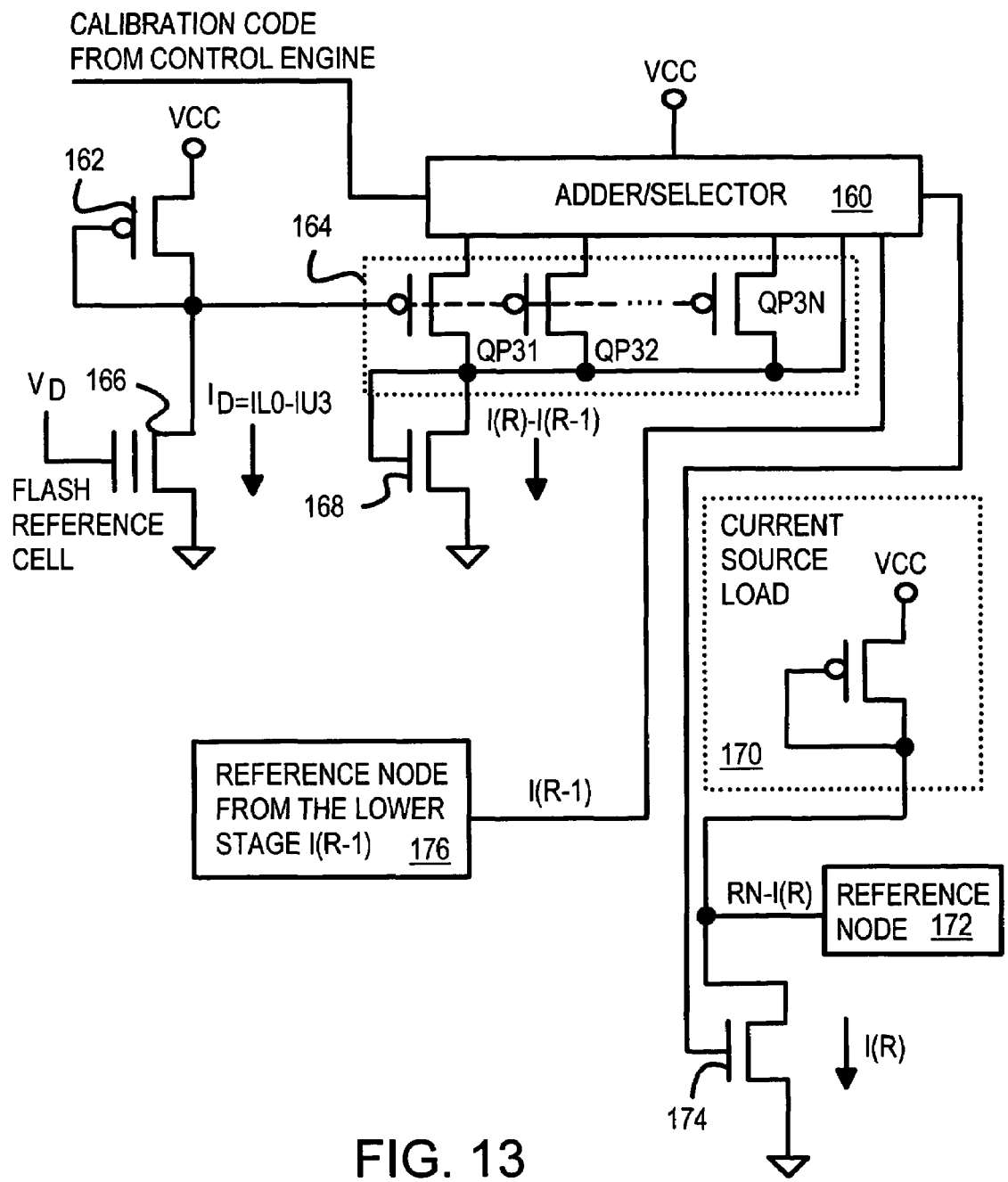
FIG. 13 is a diagram of a delta current reference generator.

FIG. 13 is a diagram of a delta current reference generator. A bias voltage is generated by the gate and drain of p-channel transistor 162 and reference FLASH cell 166, which has Vcc or another fixed voltage applied to its gate. This generated bias voltage is applied to the gates of p-channel ratioed transistors 164, which have their drains connected together and to the gate and drain of n-channel sink transistor 168. A calibration code is input to selector/adder 160, which selects some of ratioed transistors 164 for connection of their sources to Vcc, while others of transistors 164 are disconnected from Vcc. The drain currents from the selected transistors 164 are summed to generate the delta current I(R)-I(R−1).

The reference current I(R−1) from prior reference 176 is summed with the delta current from selector/adder 160 to generate the next reference voltage, which is applied to the gate of n-channel transistor 174. The drains of transistors 174 and 170 generate the next reference current RN-I(R). This reference current 172 is output to the comparator and to the next delta-current reference generator.

Figure 14:
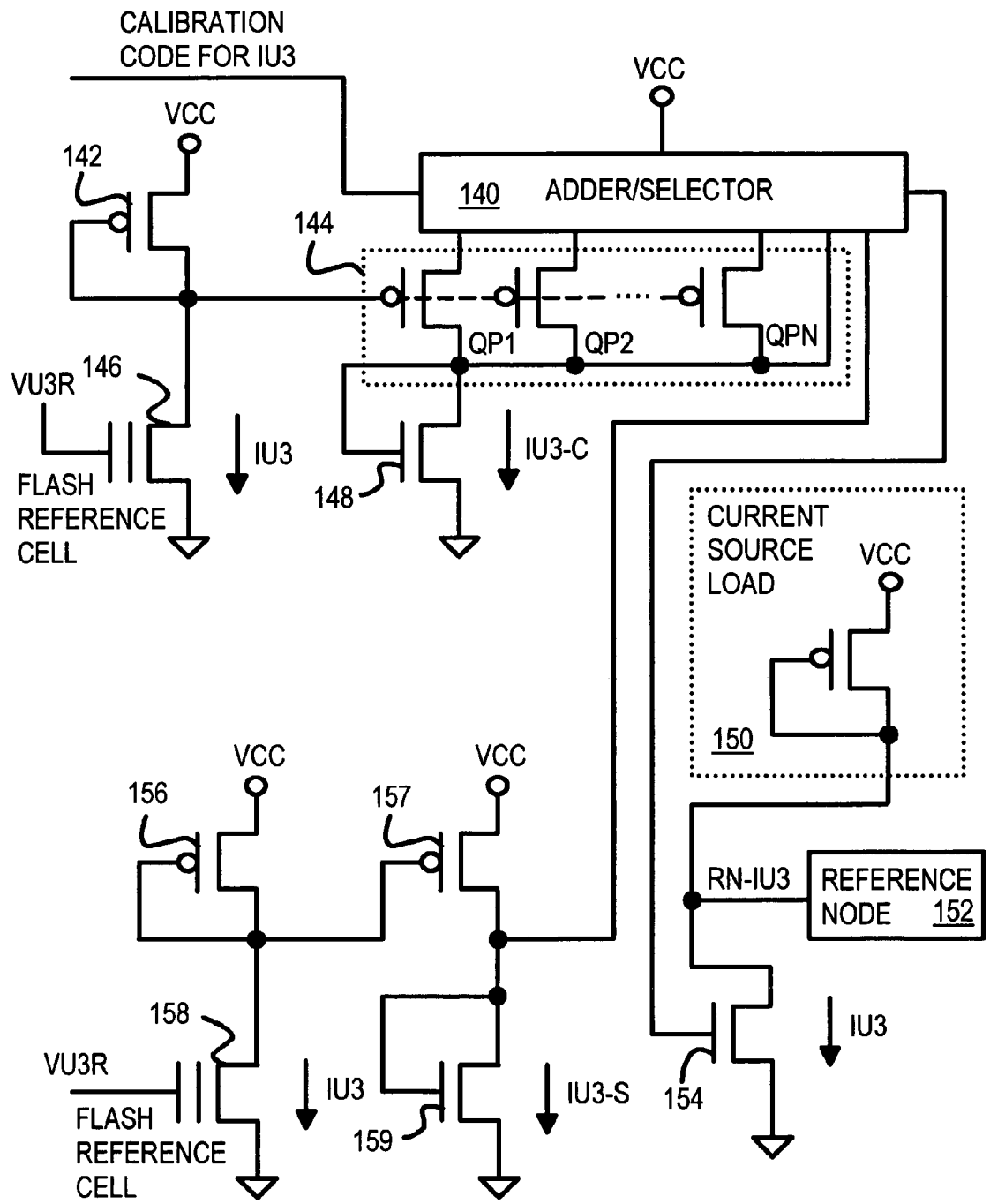
FIG. 14 is a diagram of a base current reference generator.

FIG. 14 is a diagram of a base current reference generator. The base current generator provides the smallest reference current, IU3. A bias voltage is generated by the gate and drain of p-channel transistor 142 and reference FLASH cell 146, which has a reference voltage applied to its gate. The reference voltage VU3R can be applied by an external resistor or by an internal load resistor. This generated bias voltage is mirrored to the gates of p-channel ratioed transistors 144, which have their drains connected together and to the gate and drain of n-channel sink transistor 148.

A calibration code is input to selector/adder 140, which selects some of ratioed transistors 144 for connection of their sources to Vcc, while others of transistors 144 are disconnected from Vcc. The drain currents from the selected transistors 144 are summed to generate the base current.

A base reference current IU3-S is generated by p-channel transistors 156, 157 and FLASH reference cell 158 and n-channel transistor 159. The gate of FLASH reference cell 158 receives the reference voltage VU3R.

The base reference current IU3-S is summed with the delta current from selector/adder 140 to generate the next reference voltage, which is applied to the gate of n-channel transistor 154. The drains of transistors 154 and 150 generate the next reference current RN-IU3. This reference current 152 is output to the comparator and to the next delta-current reference generator for IL3.

Alternate Embodiments

Several other embodiments are contemplated by the inventors. For example the sense amplifier and translation logic can be applied to other multi-level or multi-bit-logic volatile memory such as SRAM and DRAM. While the invention has been described as storing 2 bits per FLASH cell, with a total of 4 possible states, the invention could be extended to cells storing N bits per cell, for a total of $2^N$ states, with $2^N-1$ reference voltages. The reference voltages could be evenly spaced, or could have varying voltage gaps. Rather than voltage comparators and voltage references, current comparators or current references could be used. The control engine or other controller may be able to re-map FLASH cells that do not verify between the upper and lower limits to improve overall reliability. The average of the upper and lower counts could be an exponential average, and arithmetic average, a median, or another kind of average. The middle-count calibration test could be repeated many times and averaged.

The FLASH architecture could be implemented as a stand-alone chip, or as part of a larger system on a chip. A variety of technologies for the FLASH cell may be used. The floating gate may be a polysilicon or composite-material gate, or may be an electron or charge-trapping layer such as a nitride film between the control gate and the drain. Multi-level FLASH cells use one cell to store multiple levels, while Nitride Read-Only Memory (NROM) technology uses one cell to store multiple bits. The invention may also be applied to NROM technology as well. FLASH memory often is able to erase large blocks of cells at a time, rather than individually, but either block-erase or individual-cell-erase or some other erase granularity could be supported with this invention.

Logic states and voltages can be complemented and inverted in various ways. For example, the + and − inputs to comparators may be swapped. Many circuit and logic implementations are possible for the various blocks and circuits.

The control-gate voltage may be VL0, the lowest limit voltage of the sensing node, or may be some other value, and may even be the normal power-supply voltage Vcc. Using VL0 for both the gate and lower limit voltages may simplify the circuits.

The bit-line voltage and the sensing-node voltage may differ slightly, such as due to a voltage drop by a pass transistor connecting the two, or may be the same. For simplification of the description, the sensing and bit-line voltages are sometimes used interchangeably, but they may actually differ somewhat. Voltages along bit and sense lines may also differ due to loading effects and line resistances.

Calibration can be performed to re-set the calibration codes that determine the delta currents, and thus the voltage gaps between state boundaries. The locations of the upper and lower limits within a state can also be adjusted by changing the calibration codes. These calibration codes can be stored in registers and updated by commands sent to the FLASH memory, such as from an external controller that runs a calibration routine. An internal controller can also perform calibration periodically or upon external request, or when a certain number of errors occur.

Calibration can also be performed to change the middle and maximum counts. Increasing the middle count for a state increases the amount of time for injecting charge into the floating gates, thus tending to increase the bit-line voltage during reading of the cells. Each state can have its own middle and maximum counts that can be separately adjusted. Thus the locations of the states can be shifted relative to each other.

Being able to adjust both the reference voltages through the calibration codes and the middle counts provides great flexibility. Indeed, both adjustments may not be needed as one or the other may be sufficiently effective.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A multilevel FLASH cell architecture comprising:
   at least one FLASH cell;
   a plurality of reference generators;
   a plurality of comparators coupled to the FLASH cell via a sensing node and coupled to the plurality of reference generators; the plurality of comparators for comparing a signal of the sensing node to a full spectrum of reference voltage signals in parallel from the plurality of reference generators; and providing outputs; and
   translation logic coupled to the plurality of comparators for decoding the outputs to determine the state of the FLASH cell, wherein the plurality of reference generators are coupled together such that a first reference generator provides a base current and subsequent reference generators add sequentially increasing amount of delta current to the base current.

2. The FLASH cell architecture of claim 1 wherein the most significant bit (MSB) and the least significant bit (LSB) of the state is provided from the translation logic.

3. The FLASH cell architecture of claim 2 wherein the translation logic detects underprogramming and overprogramming of a FLASH cell by comparing the sensing node to limits for each state.

4. The FLASH cell architecture of claim 2 wherein the translation logic detects when the cell is properly programmed.

5. The FLASH cell architecture of claim 2 wherein the translation logic detects if the current state of the FLASH cell matches the desired data to indicate successful data validation.

6. The FLASH cell architecture of claim 2 wherein if the translation logic detects that the current state of the FLASH cell is less than the desired state further programming is necessary to provide the data within the desired state limits.

7. The FLASH cell architecture of claim 2 wherein if the translator logic detects that the cell is overprogrammed an error signal is detected.

8. The FLASH cell architecture of claim 1 wherein the full spectrum of reference signals include boundary reference voltages between states and upper and lower target voltages within a state.

9. The FLASH cell architecture of claim 1 wherein a margin between reference generators is adjusted by arbitration codes that select currents for summing.

10. The FLASH cell architecture of claim 1 wherein each reference voltage generator generates a current for each boundary between $2^n$ states and for an upper limit and a lower limit for each state.

11. The FLASH cell architecture of claim 1 which includes a control engine for decoding received addresses wherein the row address causes a row of cells to be activated and a column address activates the reference generators and a multichannel cell address.

12. The FLASH cell architecture of claim 1 wherein the at least one FLASH cell comprises a memory cell array.

13. The FLASH cell architecture of claim 12 wherein there are multi-level states per cell.

14. The FLASH cell architecture of claim 12 which includes an I/O buffer coupled to the translation logic.

15. The FLASH cell architecture of claim 14 which includes a write/cache buffer coupled to the translation logic.

16. The FLASH cell architecture of claim 15 which includes a fast one stage read/write control engine with progressive state indicators coupled to translation logic.

17. The FLASH cell architecture of claim 16 which includes a set of external and auto calibration registers coupled to the control engine.

18. The FLASH cell architecture of claim 17 which includes a set of reference calibration commands in addition to the read, erase and program commands.

19. The FLASH cell architecture of claim 18 which includes a voltage/current reference generator coupled to the FLASH cell memory array and the calibration registers.

20. The FLASH cell architecture of claim 19 which includes a plurality of address registers coupled to a row address decoder and a calendar address decoder.

21. The FLASH memory device of claim 12, further comprising:
- a plurality of memory cell strings each connected to x-y addressable word lines and bit lines.

22. A multilevel FLASH cell architecture comprising:
- at least one FLASH cell;
- a plurality of reference generators;
- a plurality of comparators coupled to the FLASH cell via a sensing node and coupled to the plurality of reference generators; the plurality of comparators for comparing a signal of the sensing node to a full spectrum of reference voltage signals in parallel from the plurality of reference generators; and providing outputs; and
- translation logic coupled to the plurality of comparators for decoding the outputs to determine the state of the FLASH cell, wherein the translation logic detects underprogramming and overprogramming of a FLASH cell by comparing the sensing node to limits for each state.

23. A multilevel FLASH cell architecture comprising:
- at least one FLASH cell;
- a plurality of reference generators;
- a plurality of comparators coupled to the FLASH cell via a sensing node and coupled to the plurality of reference generators; the plurality of comparators for comparing a signal of the sensing node to a full spectrum of reference voltage signals in parallel from the plurality of reference generators; and providing outputs; and
- translation logic coupled to the plurality of comparators for decoding the outputs to determine the state of the FLASH cell, wherein the most significant bit (MSB) and the least significant bit (LSB) of the state is provided from the translation logic, and wherein the translation logic detects if the current state of the FLASH cell matches the desired data to indicate successful data validation.

24. The FLASH cell architecture of claim 23 wherein if the translation logic detects that the current state of the FLASH cell is less than the desired state further programming is necessary to provide the data within the desired state limits.

25. The FLASH cell architecture of claim 24 wherein if the translator logic detects that the cell is overprogrammed an error signal is detected.

26. A multilevel FLASH cell architecture comprising:
- at least one FLASH cell;
- a plurality of reference generators;
- a plurality of comparators coupled to the FLASH cell via a sensing node and coupled to the plurality of reference generators; the plurality of comparators for comparing a signal of the sensing node to a full spectrum of reference voltage signals in parallel from the plurality of reference generators; and providing outputs;
- translation logic coupled to the plurality of comparators for decoding the outputs to determine the state of the FLASH cell; and
- a control engine for decoding received addresses wherein the row address causes a row of cells to be activated and a column address activates the reference generators and a multichannel cell address.

27. A multilevel FLASH cell architecture comprising:
- a memory cell array wherein
  - a plurality of reference generators;
  - a plurality of comparators coupled to the memory cell array via a sensing node and coupled to the plurality of reference generators; the plurality of comparators for comparing a signal of the sensing node to a full spectrum of reference voltage signals in parallel from the plurality of reference generators; and providing outputs;
- translation logic coupled to the plurality of comparators for decoding the outputs to determine the state of the memory cell array; and
- a I/O buffer coupled to the translation logic.

* * * * *